United States Patent
Bryan et al.

(10) Patent No.: US 6,426,559 B1
(45) Date of Patent: Jul. 30, 2002

(54) MINIATURE 3D MULTI-CHIP MODULE

(75) Inventors: Robert Newell Bryan, Westminster; Daniel Eisenreich, Baltimore, both of MD (US)

(73) Assignee: National Semiconductor Corporation, Santa Clara, CA (US)

(*) Notice: Subject to any disclaimer, the term of this patent is extended or adjusted under 35 U.S.C. 154(b) by 20 days.

(21) Appl. No.: 09/607,862

(22) Filed: Jun. 29, 2000

(51) Int. Cl.[7] .................... H01L 29/40; H01L 23/495
(52) U.S. Cl. .................... 257/777; 257/685; 257/666
(58) Field of Search .................... 257/777, 685, 257/686, 723, 666; 438/123; 361/813

(56) References Cited

U.S. PATENT DOCUMENTS

| | | | |
|---|---|---|---|
| 5,400,218 A | 3/1995 | Val | 361/709 |
| 5,471,369 A * | 11/1995 | Honda et al. | 361/813 |
| 5,479,051 A * | 12/1995 | Waki et al. | 257/724 |
| 5,526,230 A | 6/1996 | Val | 361/704 |
| 5,543,664 A | 8/1996 | Burns | 257/787 |
| 5,640,760 A | 6/1997 | Val et al. | 29/830 |
| 5,654,220 A | 8/1997 | Leedy | 438/25 |
| 5,656,548 A | 8/1997 | Zavracky et al. | 438/23 |
| 5,793,115 A | 8/1998 | Zavracky et al. | 257/777 |
| 5,804,004 A | 9/1998 | Tuckerman et al. | 156/60 |
| 5,834,162 A | 11/1998 | Malba | 430/317 |
| 5,885,850 A | 3/1999 | Val | 438/109 |
| 5,930,599 A * | 7/1999 | Fujimoto et al. | 438/113 |
| 5,973,403 A | 10/1999 | Wark | 257/777 |
| 5,985,693 A | 11/1999 | Leedy | 438/107 |
| 5,998,292 A | 12/1999 | Black et al. | 438/618 |
| 6,034,438 A | 3/2000 | Petersen | 257/786 |
| 6,051,878 A | 4/2000 | Akram et al. | 257/686 |
| 6,057,598 A * | 5/2000 | Payne et al. | 257/723 |
| 6,077,724 A * | 6/2000 | Chen | 438/107 |
| 6,080,264 A * | 6/2000 | Ball | 156/292 |
| 6,118,176 A * | 9/2000 | Tao et al. | 257/676 |
| 6,175,157 B1 * | 1/2001 | Morifuji | 257/777 |
| 6,177,721 B1 * | 1/2001 | Suh et al. | 257/686 |

FOREIGN PATENT DOCUMENTS

| | | | | |
|---|---|---|---|---|
| JP | 59-229850 | * | 12/1984 | 257/777 |
| JP | 3-231450 | * | 10/1999 | 257/723 |

* cited by examiner

*Primary Examiner*—Jasmine J B Clark
(74) *Attorney, Agent, or Firm*—Beyer Weaver & Thomas LLP

(57) ABSTRACT

A compact multi-chip module is provided. The multi-chip module may be built from a lead frame that does not have a die attach pad. Instead, the leads of the lead frame may define a central opening. A first semiconductor device extends across the central opening and is connected to the plurality of leads, with the leads being on a first side of the first semiconductor device. A second semiconductor is stacked on the first side of the first semiconductor device. A third semiconductor device is stacked on the second semiconductor device. A fourth semiconductor device is stacked on the third semiconductor device. The stack of semiconductor devices passes through the central opening formed by the plurality of leads. The stack of semiconductor devices is encapsulated with a thermoset plastic. The resulting final assembly may occupy no more volume than a typical single chip component.

19 Claims, 2 Drawing Sheets

MINIATURE 3D MULTI-CHIP MODULE

The United States government has rights in this invention pursuant to Contract No. MDA904-98C-2159 between the National Security Agency and National Semiconductor Corporation.

FIELD OF THE INVENTION

The present invention relates generally to semiconductor packaging. More specifically, the present invention relates to the packaging of semiconductors using multiple layers of dice.

BACKGROUND OF THE INVENTION

To facilitate discussion, FIG. 1 is a cross-sectional view of a molded integrated circuit (IC) package that may be provided by the prior art. In such an IC package 100, an integrated circuit die 104 is mounted on a die attach pad 108. Leads 112 of a lead frame extend to a location close to the IC die 104. Wires 116 extend from die bond pads on the IC die 104 to the leads 112 to provide electrical connections between the IC die 104 and the leads. A thermoset plastic casing 120 encases and surrounds the IC die 104, wires 116, and parts of the leads 112 closest to the IC die 104, leaving exposed parts of the leads 112 furthest from the IC die 104.

FIG. 2 is a planar view of the lead frame 122 with leads 112 and the die attach pad 108 shown in FIG. 1. The lead frame 122 further comprises a skirt 126 surrounding the periphery of the lead frame 122 and tie bars 130 that connect the skirt 126 to the die attach pad 108. The skirt 126 may be used to support the leads 112, which are attached to the skirt 126 and the die attach pad. During the manufacturing of the IC package, the skirt 126 is removed.

Such IC packages may require a footprint that is much greater than the footprint of the IC die. In view of the foregoing, it is desirable to provide an IC package that has a small footprint.

SUMMARY OF THE INVENTION

To achieve the foregoing and other objects and in accordance with the purpose of the present invention, a variety of techniques for providing a multi-chip module is described. Generally, a first side of a first semiconductor device is connected to a first side of the plurality of leads. A second semiconductor device is then connected to the first side of the first semiconductor.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
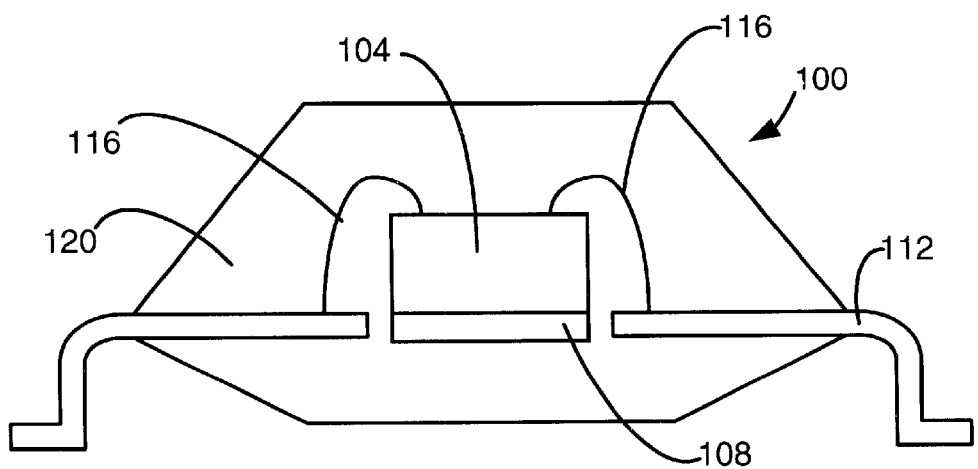
FIG. 1 is a cross-sectional view of a molded integrated circuit used in the prior art.
Figure 2:
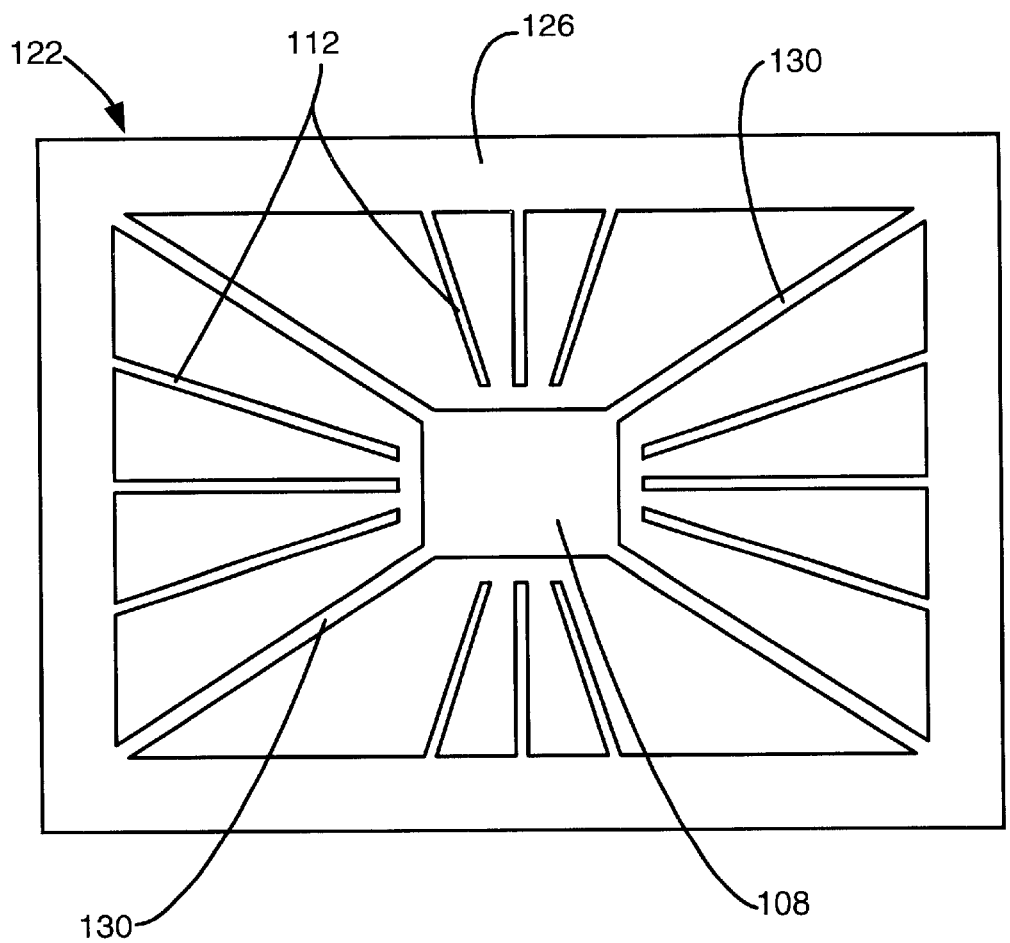
FIG. 2 is a planar view of a lead frame used in the prior art.
Figure 3:
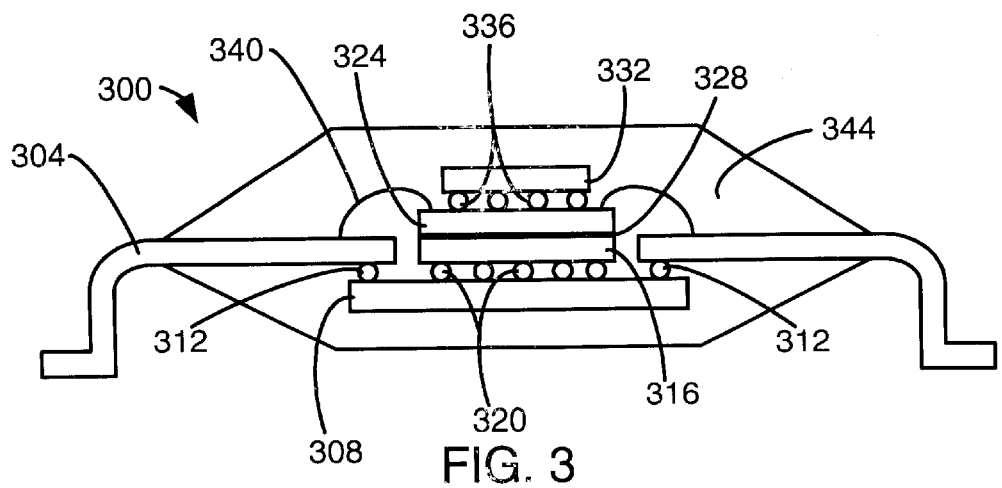
FIG. 3 is a cross-sectional view of a multi-chip module.

To facilitate discussion, FIG. 3 is a cross-sectional view of a preferred embodiment of the invention. A multi-chip module 300 comprises a plurality of leads 304 with a first semiconductor device 308 connected to the plurality of leads 304 with a first side and second side. The first semiconductor device 308, which is a die, has a first side and a second side. The first side of the plurality of leads 304 is connected to the first side of the first semiconductor device 308, so that the leads 304 are on the first side of the semiconductor device 308. A first plurality of gold balls 312 on the first side of the first semiconductor device 308 is used to both physically and electrically connect the first side of the first semiconductor device 308 to first side of the plurality of leads 304. Gold-ball thermocompression bonding is used to connect the first side of the first semiconductor device 308 to the plurality of leads 304. The gold balls may be formed by a machine that forms gold wire bond balls.

A second semiconductor device 316, with a first side and second side, is connected to and located on the first side of the first semiconductor device 308. A second plurality of gold balls 320 is used to both physically and electrically connect a first side of the second semiconductor device 316 to the first side of the first semiconductor device 308. Gold-ball thermocompression bonding is used to connect the first side of the second semiconductor device 316 to the first side of the first semiconductor device. Since the second semiconductor device 316 is stacked on the first side of the first semiconductor device, as shown in FIG. 3, the second semiconductor device 316 is placed between the plurality of leads, as shown in FIG. 3. The first side of the second semiconductor device 316 is placed adjacent to the first side of the first semiconductor device 308, separated from the first side of the first semiconductor device by the second plurality of gold balls 320.

A third semiconductor device 324 is connected to a second side of the second semiconductor device 316. An adhesive bond 328 is used to physically connect a first side of the third semiconductor device 324 to the second side of the second semiconductor device 316, so that the first side of the third semiconductor device 324 is adjacent to the second side of the second semiconductor 316. Various known adhesives may be used for connecting the first side of the third semiconductor 324 to the second side of the second semiconductor 316. A first side of a fourth semiconductor device 332 is connected to a second side of the third semiconductor device 324. A third plurality of gold balls 336 is used to both physically and electrically connect a first side of the fourth semiconductor device 332 to the second side of the third semiconductor device 324, so that the first side of the fourth semiconductor device 332 is adjacent to the second side of the third semiconductor device 324. Gold-ball thermocompression bonding is used to connect the first side of the fourth semiconductor device 332 to the second side of the third semiconductor device 324.

In the illustrated embodiment, conventional wire bonding 340 is used to electrically couple leads to associated contacts on the second side of the third semiconductor device 324. Such wire connections may be placed between leads and any of the semiconductor devices or between semiconductor devices. In the preferred embodiment, wire connections are between leads and semiconductor devices that are not directly attached to the leads and between semiconductor devices that are not adjacent to each other. The wire connections 340 between the leads 304 and the third semiconductor device 324 may be on a second side of the leads 304 opposite from the first side of the leads 304. The reason for connecting the wire connections 340 to the second side of the leads 304 is that since the stack of semiconductor devices 308, 316, 324, 332 passes between the center of the leads 304, the third semiconductor device 324 is closest to the second side of the leads 304. The first, second, third, and fourth semiconductor devices 308, 316, 324, 332, the plurality of gold balls, and ends of the leads 304 adjacent to the semiconductor devices 308, 316, 324, 332 are encapsulated with a thermoset plastic casing through an operation called transfer molding.

Figure 4:
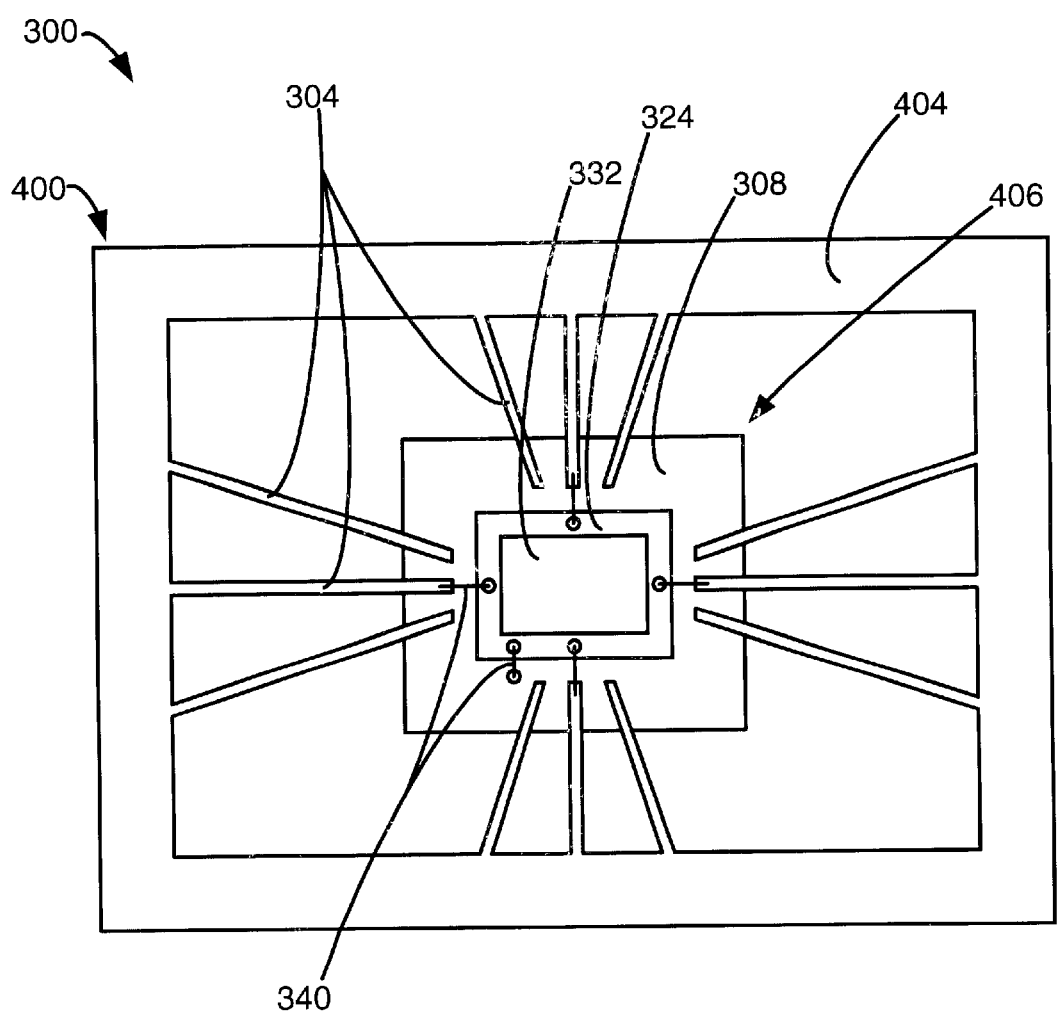
FIG. 4 is a top view of the multi-chip module during the manufacturing process.

In the manufacture of a multi-chip module, as illustrated in FIG. 3, a lead frame is provided. FIG. 4 is a top view of a lead frame 400, which may be used in the production of the multi-chip module 300. The lead frame 400 comprises the plurality of leads 304 and a skirt 404. In the preferred embodiment of the invention, the lead frame 400 does not have a die attach pad and tie bars. The absence of a die attach pad creates a central opening 406 at the center of the lead frame 400 and between the plurality of leads 304. The first semiconductor device 308 is placed across the central opening 406 and electrically and physically connected to the plurality of leads 304 by using gold-ball thermocompression bonding. As described above, the plurality of leads 304 is on the first side of the first semiconductor device 308. The second semiconductor device 316 is connected to the first side of the first semiconductor device 308 using gold-ball thermocompression bonding in conventional flip-chip processes. As shown, the second semiconductor device 316 may be smaller than the first semiconductor device 308 to allow the second semiconductor device 316 to fit within the plurality of leads 304. The third semiconductor device 324 is connected to the second semiconductor device 316 using conventional adhesive bond attachment processes. The fourth semiconductor device 332 is connected to the third semiconductor device 324 using gold-ball thermocompression bonding in conventional flip-chip processes. The first, second, third, and fourth semiconductor devices 308, 316, 324, 332 form a stack that passes through the center of the central opening between the plurality of leads 304, wherein the first semiconductor device 308 extends across the central opening 406 and the second semiconductor device is within the central opening 406, as shown. The plurality of wire bonding connections 340 is connected between leads and semiconductor devices, as shown. Facing the top, the second side of the leads 304, the first side of the first semiconductor device 308, the second side of the third semiconductor device 324, and a second side of the fourth semiconductor device 332 may be seen in FIG. 4. The first, second, third, and fourth semiconductor devices 308, 316, 324, 332 and parts of the plurality of leads closest to the first semiconductor device 308 are encapsulated with the thermoset plastic casing. The skirt 404 is then removed.

In the illustrated embodiment, the first, second, third, and fourth semiconductor devices 308, 316, 324, 332 have electrical connections only on one side. In such a situation the side with the electrical connections is designated as the front side and the side opposite the front side is designated as the back side. In the illustrated embodiment, the first side of the first semiconductor device 308, the first side of the second semiconductor device 316, the second side of the third semiconductor device 324, and the first side of the fourth semiconductor device are the front sides. The second side of the second semiconductor device 316 and the first side of the third semiconductor device 324 are back sides. Since the second side of the second semiconductor device 316 and the first side of the third semiconductor device 324 are back sides, wire connections are used to provide an electrical connection to the third semiconductor device 324.

Another preferred embodiment of the invention provides the same device as in the previous embodiment, except that the first side of the first semiconductor device is bonded to the plurality of leads by an anisotropic conductive adhesive. Anisotropic conductive adhesives are disclosed in U.S. Pat. No. 5,840,215 entitled "Anisotropic Conductive Adhesive Compositions" by Iyer et al., incorporated herein by reference. Anisotropic conductive adhesive compositions would provide conductive electrical paths, forming a plurality of conductive elements between contact pads on the first side of the first semiconductor device and a lead, while providing insulation in a transverse direction between leads and between contact pads.

In other embodiments of the invention, the gold balls may be replaced with other conductive elements such as conductive columns or pins, conductive adhesives, anisotropic conductive adhesives, or conductive balls. In other embodiments more semiconductor devices may be stacked together. Preferably, at least two semiconductor devices are stacked to form the multi-chip module. More preferably, at least three semiconductor devices are stacked to form the multi-chip module. Most preferably, at least four semiconductor devices are stacked to form the multi-chip module. In other embodiments, adhesive bonding may be substituted by conductive element arrays. In other embodiments, the third semiconductor device or fourth semiconductor device may be placed in the central opening instead of the second semiconductor device. In such cases, the stack of semiconductor devices extends through the central opening in the plurality of leads. Preferably, when the stack of semiconductor devices extends through the central opening, the first semiconductor device is not within the central opening of the plurality of leads, since the first semiconductor device extends across the central opening and is on the first side of the plurality of leads. Some or all of the semiconductor devices may be made thinner than standard semiconductor devices to meet a molded package thickness limit. Some or all of the semiconductor devices (dice or chips) may have active electrical connections on two sides. In other embodiments of the invention, the central opening may be closer to one side of the frame than another, so that when the semiconductor stack passes through the center of the central opening, the semiconductor stack may be closer to one side of the lead frame than another.

In another embodiment, the second semiconductor device has electrical connections on two opposite sides. One way of providing this is by providing a plurality of vias of electrically conducting material passing through the semiconductor device. In such an embodiment, the third semiconductor device may be connected to the second semiconductor device using gold-ball thermocompression or flip-chip processes. The third semiconductor device may also have electrical connections on two opposite sides, so that the fourth semiconductor device may be mounted on the third semiconductor device as a flip chip. In the alternative, the fourth semiconductor device may be held to the third semiconductor device using an adhesive bond, with wire connections providing electrical connections to the fourth semiconductor device. Another embodiment may provide a die attachment pad.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A multi-chip module, comprising:
   a plurality of leads with a first side and a second side;
   a first semiconductor device with a first side and a second side, wherein the first side of the first semiconductor device is connected to the first side of the plurality of leads;
   a second semiconductor device with a first side and a second side stacked on the first side of the first semiconductor device, wherein the first side of the second semiconductor device is connected to the first side of the first semiconductor device; and
   a third semiconductor device with a first side and a second side stacked on the second side of the second semiconductor device, wherein the first side of the third semiconductor device is connected to the second side of the second semiconductor device.

2. The multi-chip module, as recited in claim 1, wherein the plurality of leads defines an opening, wherein the first semiconductor device extends across the opening on the first side of the plurality of leads, and wherein the first semiconductor device, the second semiconductor device, and the third semiconductor device form a semiconductor stack which extends through the opening.

3. The multi-chip module, as recited in claim 1, further providing a casing surrounding the first semiconductor device, the second semiconductor device, the third semiconductor device, and a part of the plurality of leads connected to the first semiconductor device.

4. The multi-chip module, as recited in claim 2, further comprising a fourth semiconductor device with a first side and a second side stacked on the second side of the third semiconductor device.

5. The multi-chip module, as recited in claim 4, further comprising a first plurality of conductive elements providing electrical and physical connections between the first side of the leads and the first side of the first semiconductor device.

6. The multi-chip module, as recited in claim 5, further providing a casing surrounding the first semiconductor device, the second semiconductor device, the third semiconductor device, the fourth semiconductor device, and a part of the plurality of leads connected to the first semiconductor device.

7. The multi-chip module, as recited in claim 6, further comprising a plurality of wire connections between the second side of the plurality of leads and the second side of the third semiconductor device.

8. The multi-chip module, as recited in claim 7, wherein the first plurality of conductive elements is selected from the group consisting of conductive balls, conductive columns, conductive adhesive, anisotropic conductive adhesive, and conductive pins.

9. The multi-chip module, as recited in claim 8, further comprising a second plurality of conductive elements providing electrical and physical connections between the first side of the first semiconductor device and the first side of the second semiconductor device.

10. The multi-chip module, as recited in claim 9, wherein the second side of the second semiconductor device is connected to the first side of the third semiconductor device by an adhesive bond.

11. A multi-chip module, comprising:
    a plurality of leads with a first side and a second side;
    a first semiconductor device with a first side and a second side, wherein the first side of the first semiconductor device is connected to the first side of the plurality of leads;
    a second semiconductor device with a first side and a second side stacked on the first side of the first semiconductor device, wherein the first side of the second semiconductor device is connected to the first side of the first semiconductor device; and
    a first plurality of conductive elements providing electrical and physical connections between the first side of the leads and the first side of the first semiconductor device.

12. The multi-chip module, as recited in claim 11, wherein the first plurality of conductive elements is selected from the group consisting of conductive balls, conductive columns, conductive adhesive, anisotropic conductive adhesive, conductive balls, and conductive pins.

13. A multi-chip module, comprising:
    a lead frame having a plurality of leads;
    a first semiconductor device including a first side having a multiplicity of first contacts thereon and a second side, wherein a first set of the first contacts are electrically coupled to associated leads by a first set of conductive elements;
    a second semiconductor device having a multiplicity of second contacts thereon, wherein at least some of the second contacts are electrically coupled to associated ones of a second set of the first contacts by a second set of conductive elements; and
    a third semiconductor device stacked on the second semiconductor device, the third semiconductor device including a plurality of third contacts wherein at least some of the third contacts are electrically connected to associated leads on the lead frame by bonding wires.

14. A multi-chip module, comprising:
    a lead frame having a plurality of leads having first and second surfaces;
    a first semiconductor device including a first side having a multiplicity of first contacts thereon and a second side, wherein a first set of the first contacts are electrically coupled to the first surfaces of associated leads by a first set of contact bumps;
    a second semiconductor device having a multiplicity of second contacts thereon, wherein at least some of the second contacts are electrically coupled to the second surfaces of associated ones of the leads by bonding wires; and
    a third semiconductor device interposed between the first and second semiconductor devices, the third semiconductor device including a plurality of third contacts wherein at least some of the third contacts are electrically coupled to associated ones of the first or second contacts by a second set of contact bumps.

15. A multi-chip module, comprising:
    a lead frame having a plurality of leads having first and second surfaces;

a first semiconductor device including a first side having a multiplicity of first contacts thereon and a second side, wherein a first set of the first contacts are electrically coupled to the first surfaces of associated leads by a first set of contact bumps;

a second semiconductor device having a multiplicity of second contacts thereon, wherein at least some of the second contacts are electrically coupled to the second surfaces of associated ones of the leads by bonding wires; and a third semiconductor device stacked on top of the second semiconductor device, the third semiconductor device including a plurality of third contacts wherein at least some of the third contacts are electrically coupled to associated ones of the second contacts by a second set of contact bumps.

16. A multi-chip module, comprising:

a lead frame having a plurality of leads having first and second surfaces;

a stack of at least three semiconductor devices stacked upon one another, each semiconductor device having a plurality of contacts formed thereon, wherein, at least a first one of the semiconductor devices has a set of contacts that are coupled to the first surface of the plurality of leads, at least a second one of the semiconductor devices has a set of contacts that are coupled the second surface of the leads, and at least two of the semiconductor devices each having a set of contacts that are electrically coupled to one another by a first set of contact bumps.

17. A multi-chip module, as recited in claim 16, wherein the stack includes at least four semiconductor devices and wherein at least two pairs of the semiconductor devices have corresponding sets of contacts that are electrically coupled to one another by associated sets of contact bumps.

18. A multi-chip module, as recited in claim 17, wherein the set of contacts for at least the first one of the semiconductor devices are coupled to their associated leads by a second set of contact bumps and the set of contacts for at least the second one of the semiconductor devices are coupled to their associated leads by bonding wires.

19. A multi-chip module, as recited in claim 18, wherein the contact bumps are gold balls formed by ball bonding.

* * * * *